(12) United States Patent
Kwon et al.

(10) Patent No.: US 6,683,274 B1
(45) Date of Patent: Jan. 27, 2004

(54) WAFER SUSCEPTOR

(75) Inventors: Gi Chung Kwon, Kyunggi-do (KR); Soo Sik Yoon, Kyunggi-do (KR); Hong Sik Byun, Kyunggi-do (KR)

(73) Assignee: Junsung Engineering Co., Ltd., Kyunggi-do (KR)

( * ) Notice: Subject to any disclaimer, the term of this patent is extended or adjusted under 35 U.S.C. 154(b) by 0 days.

(21) Appl. No.: 10/295,954

(22) Filed: Nov. 18, 2002

(30) Foreign Application Priority Data

Nov. 26, 2001 (KR) ................. 10-2001-0073961

(51) Int. Cl.$^7$ .............................................. B23K 10/00
(52) U.S. Cl. ........................ 219/121.58; 219/121.52; 219/121.43; 118/725; 156/345
(58) Field of Search ................ 219/121.52, 121.4, 219/121.41, 121.43, 121.58; 204/298.06, 298.08, 298.02; 118/723 I, 724, 725; 156/345; 315/111.51, 111.21

(56) References Cited

U.S. PATENT DOCUMENTS

| | | | |
|---|---|---|---|
| 5,187,347 A | | 2/1993 | Leef |
| 5,478,429 A | * | 12/1995 | Komino et al. ............. 156/345 |
| 5,581,874 A | * | 12/1996 | Aoki et al. .................... 29/825 |
| 5,817,406 A | | 10/1998 | Cheung et al. |
| 6,082,297 A | * | 7/2000 | Pollock et al. .............. 118/725 |
| 6,308,654 B1 | * | 10/2001 | Schneider et al. .......... 118/725 |

* cited by examiner

*Primary Examiner*—Mark Paschall
(74) *Attorney, Agent, or Firm*—Oliff & Berridge, PLC

(57) ABSTRACT

Disclosed is a wafer susceptor which includes: a ceramic body; a RF electrode mounted within the ceramic body; a heater mounted within the ceramic body and spaced apart from the RF electrode by a predetermined distance to be disposed below the RF electrode; and an RF shield of a metal material, the RF shield being electrically grounded and mounted within the ceramic body, the RF shield being disposed between the RF electrode and the heater without being in contact with either the heater or the RF electrode. In case where an RF power is applied to the RF electrode, it is possible to minimize an influence of an RF noise on the heater 24. Accordingly, since the RF power can be applied to the susceptor while heating the susceptor at a high temperature, it is possible to deposit a high-density thin film and also control properties of the thin film such as stress and step coverage. Further, the invention may take the stabilization of the power system.

8 Claims, 4 Drawing Sheets

(a)

(b)

WAFER SUSCEPTOR

BACKGROUND OF THE INVENTION

1. Field of the Invention

The present invention relates to a wafer susceptor, and more particularly, to a wafer susceptor capable of functioning as the RF electrode and the heater.

2. Description of the Related Art

A plasma enhanced chemical vapor deposition (PECVD) is widely used as one of processes for manufacturing a semiconductor device. Unlike a typical chemical vapor deposition (CVD), since the PECVD proceeds to a process in a state that a process gas is activated using a plasma, it has several advantages, for example, that the process can be performed at a lower temperature than the conventional CVD.

FIG. 1 is a schematic view of a typical PECVD apparatus. Referring to FIG. 1, a susceptor 70 on which a wafer 25 is disposed is mounted within a reaction chamber 10 and an upper RF electrode 30 is mounted on an upper portion of the reaction chamber 10.

Typically, because the PECVD apparatus does not have a dual RF source, a lower electrode (i.e., the susceptor 70) is grounded. In addition, the upper electrode is a plate-shaped electrode or a dome-shaped electrode and an RF power is applied to the upper electrode. In some cases, in order to improve a characteristic of film quality, the RF power may be applied to the lower electrode (i.e., the susceptor).

If the RF power is applied to the upper RF electrode 30, a plasma is generated within the reaction chamber 10. If the plasma is generated, positive ions existing within the plasma are attracted toward the wafer 25 due to a self-bias, so that a thin film is deposited on the wafer 25. Typically, the susceptor is grounded. In some cases, however, in order to maximize this effect, the lower RF electrode 22 is mounted within the susceptor 70 and the RF power is also applied to the lower RF electrode 22. Further, a stress level of the thin film deposited on the wafer 25 can be controlled by applying the RF power to the lower RF electrode 22. Furthermore, it is possible to protect patterns formed on the wafer from being damaged due to the plasma. This is because the RF power removes charges which are accumulated between the patterns.

Meanwhile, in order to deposit a high-density film on the wafer 25, it is necessary to heat the wafer at 500° C. or higher. Typically, a heater (not shown) is mounted within the susceptor 70 for the purpose of the heating process.

If the RF power is applied to the lower RF electrode, however, the heater is affected by an RF noise so that a reliable thin film is not formed. This is because an efficiency of the plasma may be degraded and a system for controlling a temperature of the heater may be also affected.

SUMMARY OF THE INVENTION

Therefore, the present invention has been devised to solve the above problems, and it is an object of the present invention to provide a wafer susceptor functioning as the RF electrode and the heater, thereby capable of minimizing an influence of RF noise on the heater.

To achieve the aforementioned object of the present invention, there is provided a wafer susceptor comprising: a ceramic body; an RF electrode mounted within the ceramic body; a heater mounted within the ceramic body and spaced apart from the RF electrode by a predetermined distance to be disposed below the RF electrode; and an RF shield of a metal material, the RF shield being electrically grounded and mounted within the ceramic body, the RF shield being disposed between the RF electrode and the heater without being in contact with either the heater or the RF electrode.

At this time, the RF shield can be formed using a metal plate, a net or a thin film coated on the ceramic body.

BRIEF DESCRIPTION OF THE DRAWINGS

The above objects and other advantages of the present invention will become more apparent by describing in detail preferred embodiments thereof with reference to the attached drawings in which.

DETAILED DESCRIPTION OF THE PREFERRED EMBODIMENTS

Now, preferred embodiments of the present invention will be described in detail with reference to the annexed drawings.

Figure 1:
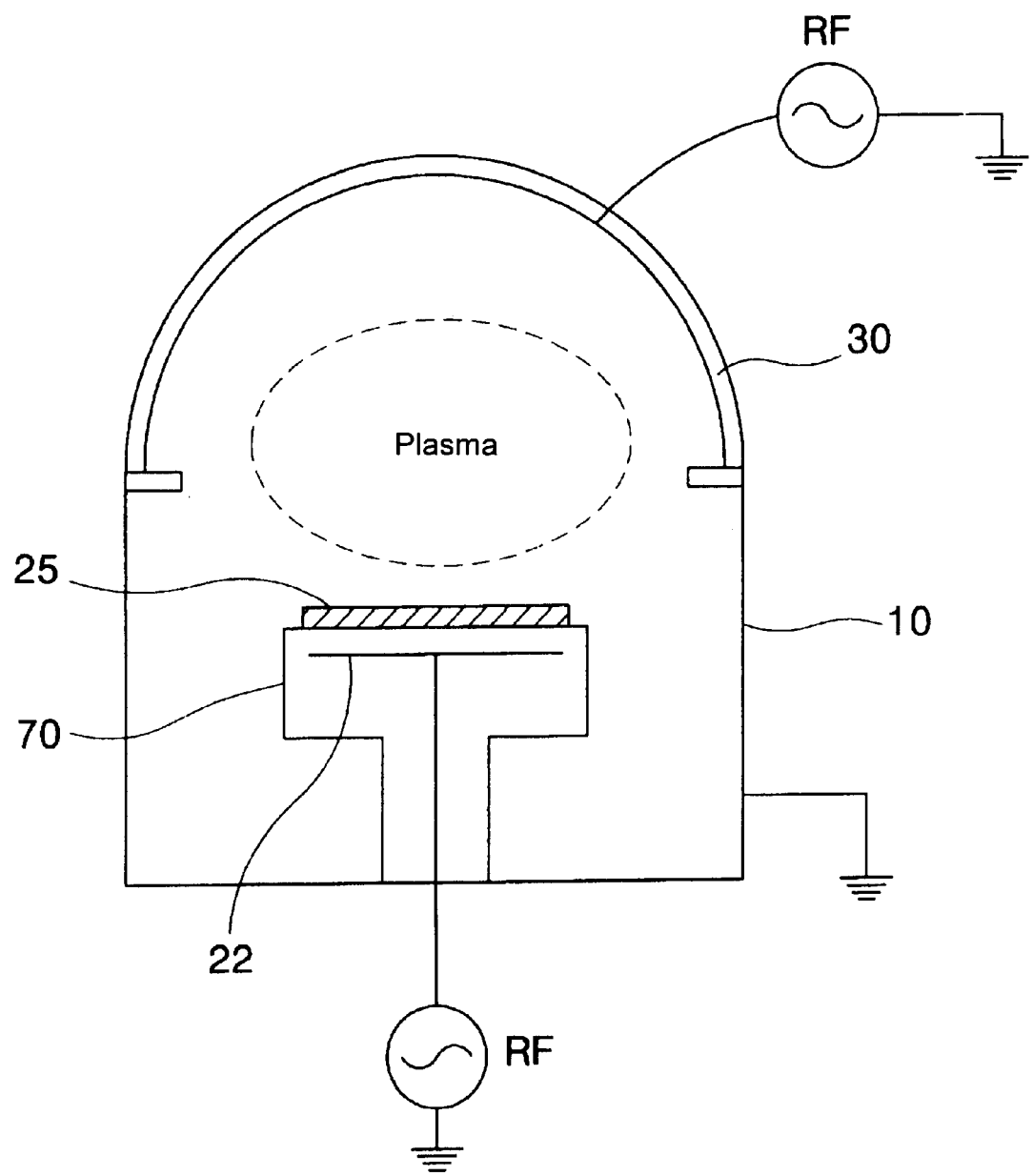
FIG. 1 is a schematic view of a typical PECVD apparatus.
Figure 2:
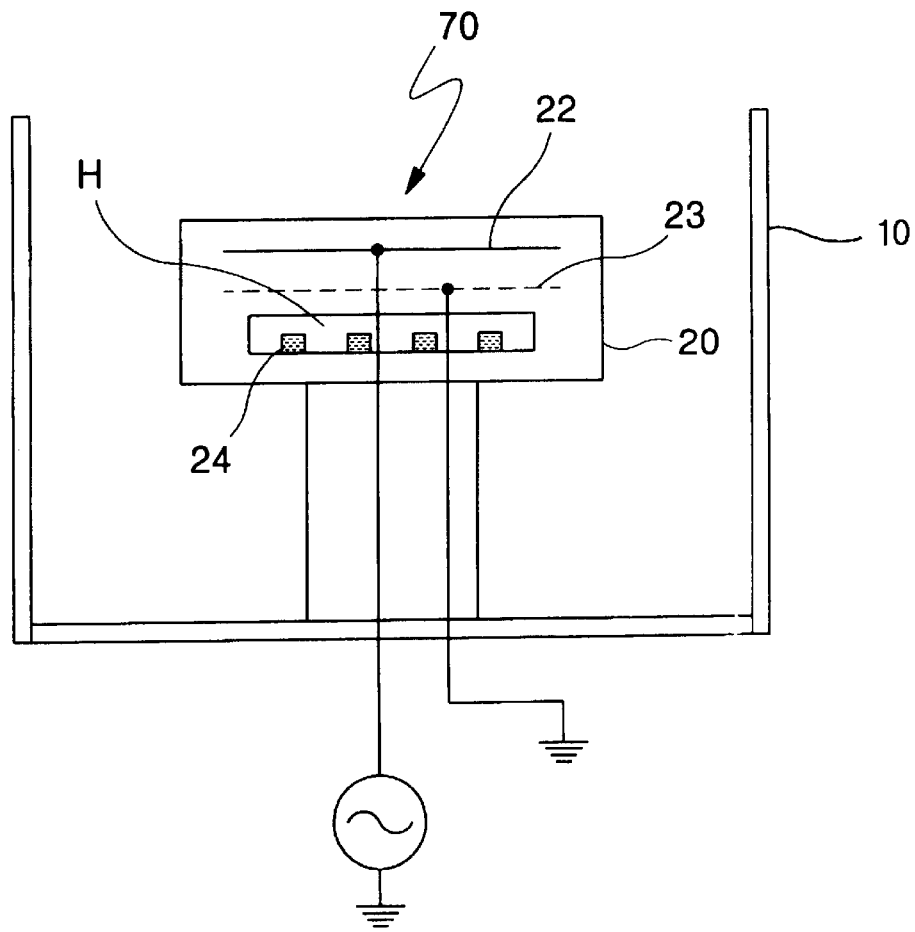
FIG. 2 is a schematic view of a wafer susceptor in accordance with an embodiment of the present invention.

FIG. 2 is a schematic view of a wafer susceptor in accordance with an embodiment of the present invention. Referring to FIG. 2, a susceptor 70 includes a ceramic body 20, an RF electrode 22, a heater 24 and an RF shield 23.

The ceramic body 20 is formed of AlN or $Al_2O_3$. All of the RF electrode 22, the heater 24 and the RF shield 23 are mounted within the ceramic body 20. The heater 24 is disposed below the RF electrode 22 and spaced apart from the RF electrode 22 by a predetermined distance. Because the heater 24 is not closely in contact with the ceramic body 20, some space H is formed around the heater 24. In this embodiment of the present invention, although it is described as an example that some space H is formed around the heater 24, it is also possible to make a structure having no space around the heater 24 by closely contacting the heater 24 with the ceramic body 20.

The RF shield 23 acts as a grid electrode for weakening an RF electric field formed between the RF electrode 22 and the heater 24. Also, the RF shield 23 is mounted between the RF electrode 22 and the heater 24 so that the heater 24 cannot be in contact with the RF electrode 22. The RF shield 23 is grounded and formed of a high-temperature resistant metal, such as SUS, molybdenum (Mo) or tungsten (W). Alternatively, the RF shield 23 can be made in a structure that the surroundings of the heater 24 are wound with the RF shield 23.

FIGS. 3A to 3D are views showing various embodiments of the susceptor 70, which is characteristic of the present invention.

Figure 3A:
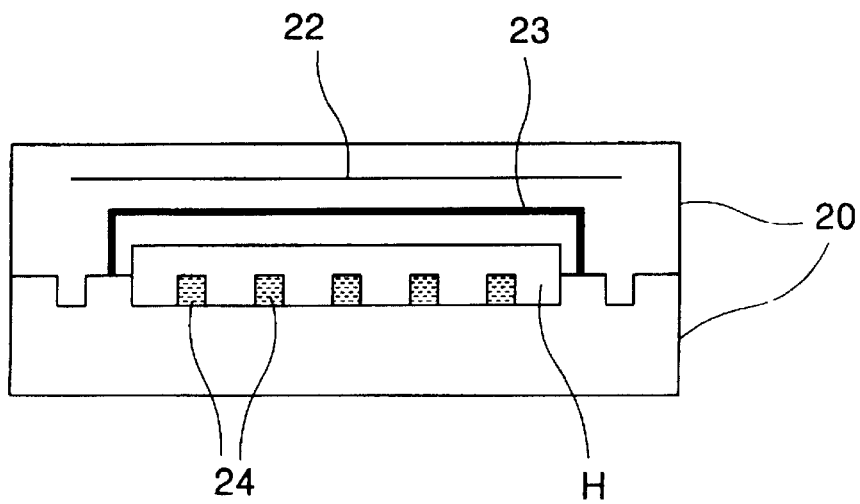
FIGS. 3A to 3D are views showing various embodiments of the susceptor in accordance with the present invention.

FIG. 3A shows a structure that the RF shield 23 is formed within the ceramic body 20 so that the RF shield 23 can cover the heater 24. Referring to FIG. 3A, the RF shield 23 is formed coating a metal thin film on the ceramic body 20. Further, the RF shield 23 can be formed in that shape by using a metal plate or a net. In case of the net, it is preferable that each hole size in the net should be 5 or 100 meshes per inch.

In case where the RF shield 23 is formed using the metal thin film, the metal thin film may be taken off due to a difference of thermal expansion coefficients between the metal thin film and the ceramic body 20. Therefore, in order to minimize an undesired influence caused by the difference of the thermal expansion coefficients therebetween, it is desirable that the metal thin film should be formed more thinly, e.g., 0.1 nm to 0.5 mm thick, as possible as can be.

Figure 3B:
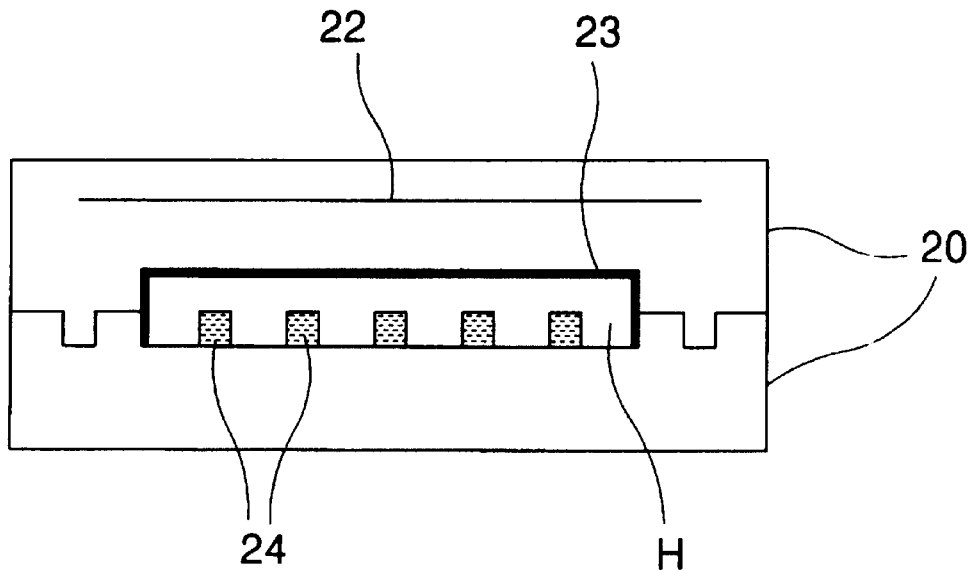

FIG. 3B shows a structure the RF shield 23 is mounted in a space H formed between the heater 24 and the ceramic body 20. Referring to FIG. 3B, a lower ceramic body is etched and the heater 24 is mounted thereon. Then, the resulting structure is covered with an upper ceramic body to thereby form the space H between the heater 24 and the ceramic body 20.

The RF shield 23 can be easily formed attaching a metal plate or a net on an upper and lateral side of the space H before coupling the upper ceramic body with the upper ceramic body. In another manner, the RF shield 23 can be easily formed coating a metal to thereby form a metal thin film before coupling the lower ceramic body with the upper ceramic body. At this time, it is noted that the RF shield 23 should not be in contact with the heater 24. Peripheral grooves can be assembled arranging the upper ceramic body and the lower ceramic body, and play a role in preventing an influence on an inner heater caused by a plasma generated from the exterior.

Figure 3C:
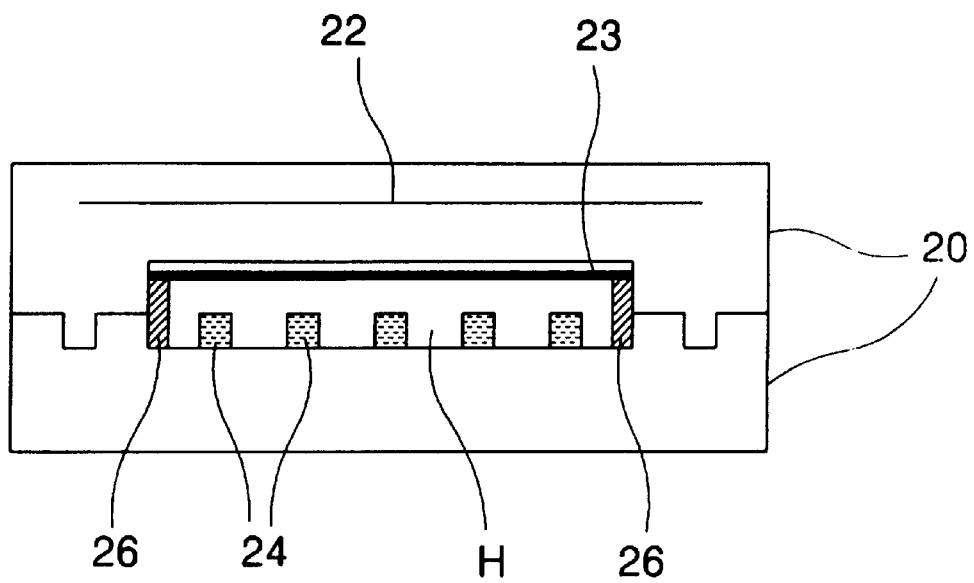

Meanwhile, referring to FIG. 3C, a ceramic pillar 26 is mounted on lateral sides of the space H. Then, the RF shield 23 can be formed disposing a metal plate or a net on the ceramic pillar 26.

Figure 3D:
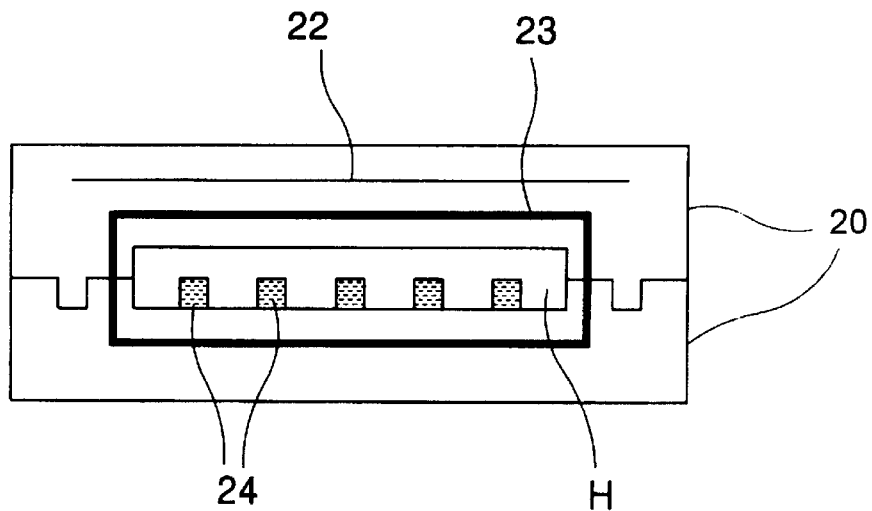
Figure 3D:
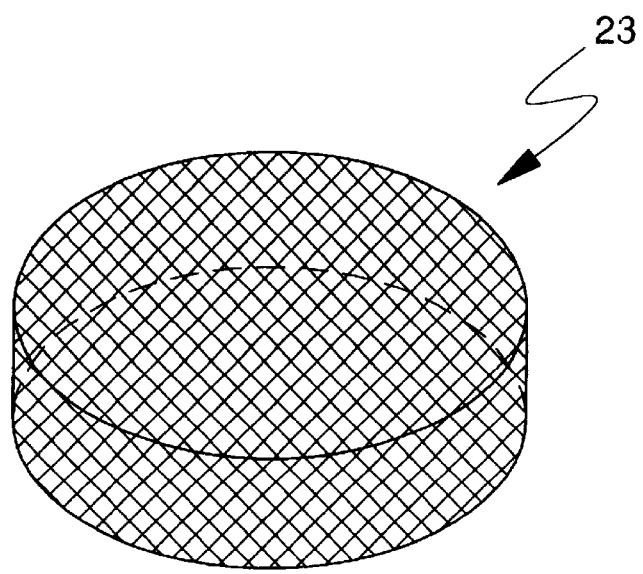

Referring to FIG. 3D, the RF shield 23 covers the heater 24. In case of such a structure, the RF shield 23 is typically formed in a cylinder type. The RF shield 23 can be formed using a metal plate or a net. Also, in some cases, the RF shield 23 can be formed coating a metal thin film on the ceramic body 20. FIG. 3D(b) is a perspective view showing a cylinder-type RF shield that uses the net.

As described above, the metal RF shield 23 is formed as a grid electrode between the RF electrode 22 and the heater 24 and is grounded, thereby minimizing an influence on the heater 24, which is caused by an RF noise in case where an RF power is applied to the RF electrode 22.

Accordingly, in accordance with the present invention, since the RF power can be applied to the susceptor 70 while heating the susceptor 70 at a high temperature, it is possible to deposit a high-density thin film and also control properties of the thin film such as stress and step coverage. Further, the present invention can stabilize a power system of the apparatus.

While the present invention has been described in detail, it should be understood that various changes, substitutions and alterations could be made hereto without departing from the spirit and scope of the invention as defined by the appended claims.

What is claimed is:

1. A wafer susceptor comprising:

a ceramic body;

an RF electrode mounted within the ceramic body;

a heater mounted within the ceramic body and spaced apart from the RF electrode by a predetermined distance to be disposed below the RF electrode; and an RF shield of a metallic material, the RF shield being electrically grounded and mounted within the ceramic body, the RF shield being disposed between the RF electrode and the heater without being in contact with either the heater or the RF electrode.

2. The wafer susceptor of claim 1, wherein the ceramic body is formed of AlN or $Al_2O_3$.

3. The wafer susceptor of claim 1, wherein the RF shield is one selected from the group consisting of SUS, molybdenum (Mo) or tungsten (W), which is resistant at a high temperature.

4. The wafer susceptor of claim 1, wherein the RF shield is formed using a metal plate, a net or a thin film coated on the ceramic body.

5. The wafer susceptor of claim 4, wherein in case the RF shield is formed using the thin film, the thin film is 0.1 nm to 0.5 mm thick.

6. The wafer susceptor of claim 4, wherein in case the RF shield is formed using the net, the net has a hole size ranged from 5 to 100 meshes per inch.

7. The wafer susceptor of claim 1, wherein the RF shield covers the heater.

8. The wafer susceptor of claim 7, wherein the RF shield is formed in a cylinder type.

\* \* \* \* \*